United States Patent Office 3,677,755

Patented July 18, 1972

3,677,755

RELIEF LITHOGRAPHIC PLATES AND PHOTOSENSITIZING SOLUTIONS

Hisaaki Fukui and Taketoshi Araki, Tokyo, and Yoshikane Fuchi, Iruma-gun, Japan, assignors to Asahi Kasei Kogyo Kabushiki Kaisha, Osaka, Japan No Drawing. Filed Aug. 28, 1969, Ser. No. 853,948
The portion of the term of the patent subsequent to Feb. 22, 1989, has been disclaimed
Int. Cl. G03c *5/00*
U.S. Cl. 96—35.1 13 Claims

ABSTRACT OF THE DISCLOSURE

A photosensitizing solution having a viscosity of about 5 to 150 centipoises at 20° C. comprising:

(I) a photopolymerizable component comprising (A) an unsaturated polyester having a fusing point above 100° C. containing in the molecule at least one segment (a) selected from the group consisting of the segment (1) of the formula:

$$-(-R_1-O-)_x$$

(wherein $R_1$ represents an alkylene group having 2 to 4 carbon atoms; *x* is 2 to 100) and the segment (2) of the formula:

$$-\left[(CH_2)_y-O-\overset{O}{\overset{\|}{C}}-R_2-\overset{O}{\overset{\|}{C}}-O\right]_z-(CH_2)_y-$$

(wherein $R_2$ represents a member selected from the group consisting of

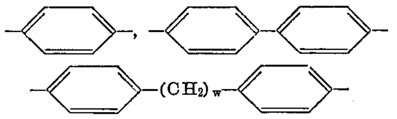

and naphthylene group; *y* is 2 to 4; *z* is 1 to 10; and *w* is 1 to 4) and the segment (b) corresponding to the residue of an unsaturated dicarboxylic acid;

(B) about 10 to 150 parts by weight, based upon 100 parts by weight of said unsaturated polyester (A), of at least one ethylenically unsaturated monomer, different from the unsaturated polyester polymer (A); and (C) about 0.01 to 5 parts by weight, based upon 100 parts by weight of said unsaturated polyester, of a photopolymerization initiator;

(II) at least one solvent selected from the group consisting of chlorinated aliphatic hydrocarbons, brominated aliphatic hydrocarbons, ketones, cyclic ethers and pyridine, said solvent having a relative drying velocity of 500 to 10,000.

This photosensitizing solution is coated in a thickness between 10 to 200μ on a support and exposed to actinic light through an image transparency. Then, the non-exposed area is removed and the surface is treated with a desensitizing agent to give a relief lithographic plate.

This invention relates to relief lithographic plates. It more particularly refers to novel photosensitizing solutions which are useful for preparing relief lithographic plates.

Heretofore, there were two types of lithographic plates. One includes lithographic plates having a relief of 5 to 10μ in thickness prepared from an albumen sensitizer and the other includes presensitized plates and wipe-on plates which are further classified into azo resin or azido resin sensitizing solutions and photopolymer-type sensitizing solutions mainly comprising a photopolymerizable component. However, the adhesive strength and abrasion of the image area according to said lithographic plates and the plates from said azo resin or azido resin sensitizing solutions are low and at most 50,000 to 60,000 copies may be produced from a single plate. Further, as the thickness of the image area of such plates are in the range of 5 to 10μ after etching or development, the clearness and accuracy of prints are remarkably lost. Therefore deep-etch planoplates which substantially avoid such disadvantages have an advantage over these plates in spite of the complicated process for preparing such. As presensitized plates, "Riston" (trademark by E. I. du Pont de Nemours & Co.) and "Kontrol Plate" (trademark by Ball Brothers Co.) produced from a photopolymer-type photopolymerizable component are on sale. However, the thickness of photopolymerizable layer of these presensitized plates are the same as that of the conventional ones from a diazo resin sensitizing solution.

It is an object of this invention to provide a novel photosensitizing solution which is particularly useful in the production of relief lithographic plates.

Another object of this invention is to provide a novel relief lithographic plate which substantially avoids the difficulties of prior art relief lithographic plates.

Other and additional objects of this invention will become apparent from a consideration of this entire specification and the claims.

In accord with and fulfilling these objects, one aspect of this invention resides in a photosensitizing solution comprising:

(I) a photopolymerizable component containing (A) an unsaturated polyester having a fusing point above 100° C. comprising a polycondensation reaction product of at least one member (a) selected from the group consisting of compounds (1) of the formula:

$$HO-(R_1-O)_x-H$$

(wherein $R_1$ represents alkylene group having 2 to 4 carbon atoms; *x* is 2 to 100) and compounds (2) of the formula:

$$HO-\left[(CH_2)_y-O-\overset{O}{\overset{\|}{C}}-R_2-\overset{O}{\overset{\|}{C}}-O\right]_z-(CH_2)_y-OH$$

(wherein $R_2$ represents a member selected from the group consisting of

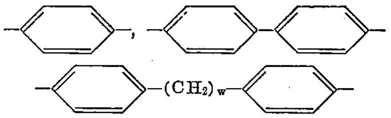

and naphthylene group; *y* is 2 to 4; *z* is 1 to 10; and *w* is 1 to 4) and (b) an ethylenically unsaturated dicarboxylic acid;

(B) About 10 to 150 parts by weight, based upon 100 parts by weight of said unsaturated polyester (A), of at least one ethylenically unsaturated monomer, different from the unsaturated polyester polymer (A); and (C) About 0.01 to 5 parts by weight, based upon 100 parts by weight of said unsaturated polyester, of a photopolymerization initiator;

(II) At least one solvent selected from the group consisting of chlorinated aliphatic hydrocarbons, brominated aliphatic hydrocarbons, ketones, cyclic ethers and pyridine, said solvent having a relative drying velocity of 500 to 10,000.

Another aspect of this invention resides in the photopolymerized product of the photopolymerizable layer described herein. This photopolymerized product is excellent for relief lithographic plates.

Still another aspect of this invention lies in the production of a relief lithographic plate by forming a photopolymerizable layer by coating a support with the photosensitizing solution in a thickness between 10 to 200μ, exposing a selected area of said layer to actinic light until photopolymerization of the exposed area of said layer is substantially completed, removing the nonexposed area and subsequently treating the surface of the resulting layer with a desensitizing agent.

By using such photosensitizing solutions which are of the solvent-drying off type, mainly comprising an unsaturated polyester, photopolymerizable layers of any desired thickness from 10 to 200μ with a high accuracy of thickness may be formed. In the preparation of a relief lithographic plate these photosensitizing solutions are not affected by temperature and moisture, and the time for exposure to actinic light may be maintained constant in any atmospheres. Only the conventional treatment with a desensitizing agent after development of the polymer is necessary and the steps of lacquer-coating and etching need not be used. Thus, the steps in the preparation of lithographic plates are reduced and the working efficiency is appreciably improved.

The relief lithographic plates according to the present invention are novel printing plates and may be said to have the intermediate characteristics between those of lithographic plates and plates for dry-offset printing. In printing with these plates a conventional offset printing machine is employed. Although the image area is relief-type, a high-speed printing of over 10,000 copies per hour is possible. When the thickness of the image area is in the range of 150 to 200μ a dry-offset printing may be employed.

An unsaturated polyester in the photopolymerizable component is produced by the conventional condensation reaction of an "etherdiol" corresponding to the above-described compound (1) and having the formula:

$$HO-(R_1-O)_x-H$$

(wherein $R_1$ represents alkylene group having 2 to 4 carbon atoms; $x$ is 2 to 100) and/or an "esterdiol" corresponding to the above-described compound (2) and having the formula:

$$HO-\left[(CH_2)_y-O-\overset{O}{\overset{\|}{C}}-R_2-\overset{O}{\overset{\|}{C}}-O\right]_z-(CH_2)_y-OH$$

(wherein $R_2$ represents a member selected from the group consisting of

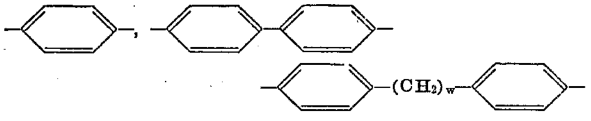

and naphthylene group; $y$ is 2 to 4, $z$ represents 1 to 10; $w$ is 1 to 4) with an unsaturated dicarboxylic acid or the derivative thereof.

Exemplary etherdiols include polyethyleneglycols having 2 to 100 of $-CH_2-CH_2O-$ group in the main chain, polypropyleneglycols having 2 to 100 of $$-CH_2CH(CH_3)O-$$

group or $-CH_2CH_2CH_2O-$ group in the main chain, polybutyleneglycols having 2 to 50 of $$-CH_2CH_2CH_2CH_2O-$$

group in the main chain and copoly (oxyethylene-oxypropylene)glycols having 2 to 50 of $-CH_2CH_2O-$ group and $-CH_2CH(CH_3)O-$ group respectively in the main chain.

The esterdiols may be easily and readily produced by the condensation reaction of a polymethyleneglycol having the formula:

$$HO-(CH_2)_y-OH$$

(wherein $y$ is 2 to 4) with an aromatic dicarboxylic acid or the methyl or ethylester thereof having a formula:

$$R_3-O-\overset{O}{\overset{\|}{C}}-R_2-\overset{O}{\overset{\|}{C}}-O-R_3$$

(wherein $R_2$ represents a member selected from the group consisting of

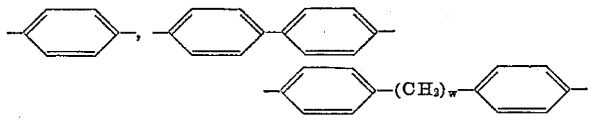

and naphthylene group; $R_3$ represents a member selected from the group consisting of hydrogen atom, methyl and ethyl group; $w$ is 1 to 4).

Such esterdiols are produced by (A) reacting the above-described polymethyleneglycol with, for example, the above-described aromatic dicarboxylic acid dimethylester in an inert gas atmosphere at a temperature between 150° and 300° C. in such amounts as to provide an esterdiol having a desired degree of polymerization or a desired molecular weight with the produced methanol being distilled off or by (B) adding a or more times moles of a polymethyleneglycol to, for example, an aromatic dicarboxylic acid dimethylester in an inert gas atmosphere at a temperature between 150° and 200° C. with the produced methanol being distilled off and raising the temperature of the resulting reaction mixture to between 200° and 300° C. and, if necessary, with the produced polymethyleneglycol being distilled off under reduced pressure to provide an esterdiol having a desired degree of polymerization or a desired molecular weight.

The polymethyleneglycols include, for example, ethyleneglycol, 1,3-propanediol and 1,4-butanediol.

Exemplary aromatic dicarboxylic acids or methyl or ethylesters thereof utilized for the preparation of above-described esterdiols include terephthalic acid,
p,p'-biphenyldicarboxylic acid,
bis-(p-carboxyphenyl)-methane,
1,2-bis-(p-carboxyphenyl)-ethane,
1,3-bis-(p-carboxyphenyl)-propane,
1,4-bis-(p-carboxyphenyl)-butane,
1,5-naphthalene-dicarboxylic acid,
1,2-naphthalene-dicarboxylic acid,
2,6-naphthalene-dicarboxylic acid,
2,7-naphthalene-dicarboxylic acid, and
dimethyl and diethylesters thereof.

Exemplary unsaturated dicarboxylic acids and derivatives thereof utilized for the preparation of the first component i.e. an unsaturated polyester include maleic acid, fumaric acid, citraconic acid, methaconic acid, itaconic acid, glutaconic acid, muconic acid, aconitic acid, lower alcohol esters thereof, for example, dimethyl and diethylesters thereof, maleic anhydride, citraconic anhydride.

In order to change hardness or flexibility of the photopolymerizable component after photopolymerization by varying the double bond equivalent (the molecular weight per one double bond) in an unsaturated polyester a part of the segment (3) corresponding to an ethylenically unsaturated dicarboxylic acid or the derivative thereof may be substituted with a saturated or aromatic dicarboxylic acid or the derivative thereof. When the amount of such saturated or aromatic dicarboxylic acid or the derivative thereof is more than 90 mole percent of the ethylenically unsaturated dicarboxylic acid or the derivative thereof, the chemical resistance and the tensile strength of the photopolymerizable component after photopolymerization becomes unfavourably lower.

Such saturated or aromatic dicarboxylic acids (non-ethylenically unsaturated) and the derivatives thereof include, for example, malonic acid, methylmalonic acid, succinic acid, methylsuccinic acid, glutaric acid, sebacic acid, phthalic acid, isophthalic acid, terephthalic acid and the lower alcohol esters thereof such as dimethylester and diethylester.

The unsaturated polyesters containing segments derived from the compounds (1) and/or (2) and the acid (b) of this invention are produced by reacting said etherdiol or said esterdiol or the mixture thereof with said ethylenically unsaturated dicarboxylic acid or a derivative thereof and, if necessary, a saturated dicarboxylic acid or a derivative thereof as aforesaid, in an inert atmosphere at a temperature of 150° C. to 300° C. Thus produced unsaturated polyesters have a fusing point above 100° C.

Exemplary ethylenically unsaturated monomers (b) include acrylamides such as acrylamide,
methacrylamide,
N-hydroxymethylacrylamide,
N-hydroxymethylmethacrylamide,
N-methoxymethylacrylamide,
N-methoxymethylmethacrylamide,
N-ethoxymethylacrylamide,
N-ethoxymethylmethacrylamide,
N-butoxymethylacrylamide,
N-butoxymethylmethacrylamide,
N,N'-methylenebisacrylamide,
N,N'-methylenebismethacrylamide,
N,N'-hexamethylenebisacrylamide,
N,N'-hexamethylenebismethacrylamide, acrylic acid and acrylates such as propylacrylate, butyl acrylate, 2-hydroxyethyl acrylate, 2-hydroxypropyl acrylate, ethyleneglycol diacrylate, propyleneglycol diacrylate, diethyleneglycol diacrylate, triethyleneglycol diacryate, polyethyleneglycol diacrylate (an average molecular weight of the polyethyleneglycol being below about 2000), polypropyleneglycol diacrylate (an average molecular weight of the polypropyleneglycol being below about 2000), 1,4-butyleneglycol diacrylate, glycerin triacrylate, trimethylol propane triacrylate, allyl acrylate, glycidyl acrylate, cyclohexyl acrylate, tetrahydrofurfuryl acrylate, methacrylic acid or methacrylates such as propyl methacrylate, butyl methacrylate, 2-hydroxyethyl methacrylate, 2-hydroxypropyl methacrylate, ethyleneglycol dimethacrylate, propyleneglycol dimethacrylate, diethyleneglycol dimethacrylate, triethyleneglycol dimethacrylate, polyethyleneglycol dimethacrylate (an average molecular weight of the polyethylene glycol being below about 2000), polypropylene glycol dimethacrylate (an average molecular weight of the polypropyleneglycol being below about 2000), 1,4-butyleneglycol dimethacrylate, glycerin trimethacrylate, trimethylolpropane trimethacrylate, allylmethacrylate, glycidyl methacrylate, cyclohexyl methacrylate, tetrahydrofurfuryl methacrylate; alpha-substituted acrylic acid such as alpha-chloroacrylic acid, alpha-bromoacrylic acid, styrene and derivatives thereof such as p-vinylphenol, p-vinylbenzoic acid, divinylbenzene; vinyl esters such as vinylstearate, vinyl benzoate; allylesters such as allylmethacrylate, diallyl phthalate; N-vinyl phthalimide and N-vinyl succinimide.

It is preferred to employ such an ethylenically unsaturated monomer in amounts of from about 10 to 150 parts by weight based upon 100 parts by weight of the unsaturated polyester. When the amount of said unsaturated monomer is below 10 parts by weight, the rate of the photo crosslinking reaction is very slow and a mechanical strength after photocrosslinking is small for the practical use. When said amount is above 150 parts by weight, a flexibility after photocrosslinking is impaired and a chemical resistance is lowered.

Examples of suitable photopolymerisation initiators include benzoins such as benzoin, alphamethylbenzoin, benzoin methyl ether, benzoin ethyl ether, alpha-phenylbenzoin, alpha-allylbenzoin; phenones such as acetophenone, benzophenone, omega-bromoacetophenone disulphides such as diphenyl disulphide, tetraethylthiuram disulphide, diketones such as benzyl, diacetyl; 2-naphthalene sulfonyl chloride.

These photopolymerization initiators are preferably used in an amount of about 0.01 to 5 parts by weight based upon 100 parts by weight of the unsaturated polyester. When the amount of the photopolymerization initiator is less than 0.01 part by weight, the photopolymerization reaction is greatly retarded and is too slow for practical commercial purposes. On the other hand, amounts of initiator of more than 5 parts by weight do not significantly increase the reaction rate and would be uneconomical.

Known thermal polymerization inhibitors may be employed for the purpose of maintaining storage stability (shelf life) of the photosensitizing solutions. Such stabilizers may be added when the components of a photosensitizing solution are admixed or may be added to each component separately prior to admixing of the components.

Exemplary thermal polymerization inhibitors include hydroquinone, mono-tert-butyl hydroquinone, phenothiazine, p-diaminobenzene, beta-naphthol, alpha-naphthol, naphthylamine, pyrogallol, cuprous chloride and nitrobenzene. These inhibitors are added only for completely preventing polymerization reaction without the actinic radiation set forth above without restraining the photopolymerization reaction. Consequently the amount of the stabilizers may preferably be about 0.01 to 2 parts by weight based upon 100 parts by weight of the unsaturated polyester.

Furthermore, a variety of compounds such as fillers and plasticizers may be incorporated with the photopolymerizable compositions. These compounds, include, for example, polymethylmethacrylates, polystyrenes, polyurethanes, polyvinylchlorides, poly(styrene-butadiene) polymers, polybutadienes, natural rubbers, polyvinylbutyrals, polyvinylpyrrolidone, soluble polyamides, polyvinylacetates, alkyd resins, saturated polyesters, cellulose acetates, glass fibers, glass cloths, fine powdery silicon oxides, fine powdery calcium carbonate and mica.

The photosensitizing solution of this invention are readily photopolymerized by actinic radiation having wave lengths below 7,000 angstroms, generally between 2,000 and 5,000 angstroms. Practical sources of such actinic radiation include carbon arc lamps, high pressure mercury lamps, low pressure mercury lamps, UV fluorescent lamps and xenon lamps.

The photosensitizing solutions according to the present invention are obtained by dissolving the photopolymerizable component in a solvent. Such a solvent is required to have a relative drying velocity $V_r$ of 500 to 10,000, preferably 1,000 to 5,000, expressed by the formula:

$$V_r = P \times M$$

wherein P represents a vapor pressure (mm. Hg) of the solvent at 20° C. and M represents a molecular weight of the solvent. As for a solvent mixture, the relative drying velocity is expressed by the following formula:

$$V_r = \sum_{i=1}^{i} (P \times M)_i m_i$$

wherein P and M are the same as defined above and $m_i$ represents mole fraction of $i$ kinds of solvents. With relative drying velocities below 500, a layer of photopolymerizable component after coating is lacking in the accuracy of thickness and a radiate unevenness is observed on the surface of the layer. On the other hand when the relative drying velocity is above 10,000, it is difficult to control the thickness of layer and the image area is not clear.

The solvents according to the present invention include, chlorinated aliphatic hydrocarbons such as dichloromethane, chloroform, tetrachloromethane, 1,2-dichloroethane, trichloroethylene, tetrachloroethylene, brominated aliphatic hydrocarbons such as dibromoethane, isobutyl bromide, isoamyl bromide; ketones such as acetone, methylethyl ketone, diacetone alcohol; cyclic ethers such as dioxane, tetrahydrofuran, dioxolan, tetrahydropyrane; and pyridine. It is preferred to employ a solvent mixed of a cyclic ether and a ketone or a mixture solvent of a chlorinated aliphatic hydrocarbon and a ketone. In order to improve the surface conditions of a photosensitizing solution after coating and to control the relative drying velocity of a photosensitizing solution, there may preferably be employed a lower aliphatic alcohol having 1 to 4 carbon atoms such as methanol, ethanol, isopropanol and normal butanol together with the above-described solvent. The weight ratio of the photopolymerizable component to the solvent is preferably in the range of 1:5 to 1:25. When the ratio is less than 1:5, a part of the photosensitizing solution is precipitated and the storage stability becomes poor. On the other hand, ratios of more than 1:25 decrease the thickness of coated layer and make it difficult to control the thickness of layer.

The photosensitizing solutions according to this invention preferably have a viscosity of about 5 to 150 centipoises.

Examples of suitable supports include paper such as resin and clay sized paper, resin coated paper, metals or alloys such as aluminum, zinc, copper, magnesium, aluminum plated with copper, iron plated with copper, copper plated with chromium, stainless steel or bronze, plastics such as polyesters, polyamides, polyvinylchlorides, polymethylmethacrylates or polystyrenes and cellulose esters. The thickness of these supports are preferably in the range of 0.1 to 2.0 mm. Especially aluminum plates of 0.3 to 0.5 mm. in thickness and zinc plates of 0.3 to 1.0 mm. in thickness are preferred.

The photosensitizing solutions are especially effective for the production of relief lithographic plates.

For example, in preparing a relief lithographic plate, a support to be utilized for offset printing such as aluminum plates of 0.3 to 0.5 mm. in thickness and zinc plates of 0.3 to 1.0 mm., which surface is usually grained at about 600 to 800 mesh, is coated with the photosensitizing solution by hand or by a whirler for printing plates at a rotating rate of about 30 to 300 r.p.m., a roll coater at a rotating rate of about 5 to 100 r.p.m. or a flow coater with an edge clearance of about 0.1 to 1.0 mm. at a feeding volume of about 20 to 5,000 cc./min. at a rate of the conveyor of about 0.5 to 120 m./min. When the photosensitizing solution is used for preparation of relief lithographic plates for a convenient offset printing, the surface of support is not necessarily grained. After the solvent is removed by drying, the resulting plate is placed in a vacuum frame and exposed at room temperature to a source irradiating actinic radiation through a process negative film. The suitable time for exposure varies depending upon the thickness of the layer of the photopolymerizable component while the time is almost constant with the conventional photosensitizing solution. After removal of the negative film, the non-image areas are washed out with a 0.01 to 2% by weight aqueous solution of sodium hydroxide, potassium hydroxide, sodium carbonate or calcium hydroxide. A processor with a spray nozzle or a brush is preferable but hand washing and a pouring type washing are also possible. The surface of the plate is then treated with a desensitizing agent. Such desensitizing agents include, for example, hydrophilic colloids of gum arabic such as "AGUM·O" and "AGUM·Z" (trademarks by Hannseggen, Hanover) on sale or C.M.C., phosphoric acid, nitric acid and calcium or ammonium salts thereof, organic acids and sodium, potassium or calcium salts thereof. The sensitizing agent is usually coated with a soft sponge by hand.

Thus obtained relief lithographic plates exhibit a remarkably improved printing abrasion compared with the conventional presensitized plates or deep-etch planoplates and over 300,000 prints can be produced from a single plate. Using these relief lithographic plates, a printing speed is increased and neither abrasion of the plates nor peeling-off of the image area is observed with a high-speed offset printing machine. Further, as the image area of the plates according to the present invention are relief-type, the slur of printing ink is remarkably reduced due to a small amount of damping-water. Consequently, clear and accurate prints are obtained. Also it is possible to print embossed paper or foamed material with the relief lithographic plates of this invention.

This invention will be illustrated by the following examples which are in no way limiting upon the scope hereof. Parts are by mole unless expressly stated to the contrary.

EXAMPLES 1 TO 14

To 100 g. of the unsaturated polyester produced from the diol component and the dicarboxylic acid component set forth in Table 1 there were added 15 g. of ethylenedimethacrylate, 25 g. of methacrylamide, 0.5 g. of 2-naphthalene sulfonyl chloride and 0.01 g. of naphthylamine and 100 g. of the resulting mixture were dissolved in 2,000 g. of 1,2-dichloroethanepyridine in a 3:2 mole ratio (referred to as "A solution") and in 1,800 g. of tetrahydrofuran-ethanol in a 1:1 mole ratio (referred to as "B solution"), respectively. An aluminum plate of 0.3 mm. in thickness, grained at 600 mesh, was coated with A solution and B solution, respectively, by a whirler for printing plate at a rotating rate of 60 r.p.m. to produce a photosensitizing plate. The plate was placed in a vacuum frame and exposed to a 5 kw. carbon arc lamp at a distance of 1 m. for 50 seconds through a negative film of 150 lines per inch and developed with a 0.5% aqueous sodium hydroxide solution and coated with a rubber solution "AGUM·O" (trademark by Hannseggen, Hanover) with a cellulose sponge by hand to give a relief lithographic plate. Using each of the resulting plates, a conventional offset printing was carried out to give clear and precise prints.

TABLE 1

| Ex. No. | Diol: Etherdiol | Diol: Esterdiol | Dicarboxylic acid: Unsaturated dicarboxylic acid | Dicarboxylic acid: Saturated dicarboxylic acid | Fusing point of unsaturated polymer (° C.) | Photosensitizing solution | Viscosity (cp.) |
|---|---|---|---|---|---|---|---|
| 1 | Polyethyleneglycol (average molecular weight: 200). | | Fumaric acid | | 110 | A<br>B | 8<br>10 |
| 2 | do | | do | Adipic acid | 104 | A<br>B | 6<br>8 |
| 3 | 1,4-butanediol | | Maleic acid | | 115 | A<br>B | 8<br>11 |
| 4 | do | | do | Adipic acid | 110 | A<br>B | 6<br>9 |
| 5 | | Ethyleneglycol-dimethyl terephthalate (average molecular weight: 1,055). | Fumaric acid | | 184 | A<br>B | 17<br>14 |

See footnotes at end of table.

TABLE 1—Continued

| Ex. No. | Diol: Etherdiol | Diol: Esterdiol | Dicarboxylic acid: Unsaturated dicarboxylic acid | Dicarboxylic acid: Saturated dicarboxylic acid | Fusing point of unsaturated polymer (° C.) | Photosensitizing solution | Viscosity (cp.) |
|---|---|---|---|---|---|---|---|
| 6 | | do | do | Succinic acid | 180 | A<br>B | 16<br>14 |
| 7 | | 1,3-propaneglycol-p,p'-bisphenyl-dicarboxyl methyl (average molecular weight: 2,286). | Itaconic acid | | 176 | A<br>B | 15<br>13 |
| 8 | | do | do | Succinic acid | 174 | A<br>B | 15<br>13 |
| 9 | Diethylene glycol | 1,4-butanediol-dimethyl terephthalate | Fumaric acid | | 151 | A<br>B | 11<br>14 |
| 10 | do | do | do | Adipic acid | 148 | A<br>B | 11<br>13 |
| 11 | do | Ethyleneglycol-naphthalic acid (average molecular weight: 3,015). | Glutaconic acid. | | 142 | A<br>B | 12<br>11 |
| 12 | do | do | do | Malonic acid | 140 | A<br>B | 13<br>10 |
| 13 | Polyoxyethyleneglycol (average molecular weight: 600). | Ethyleneglycol-dimethyl terephthalate (average molecular weight: 1,055). | Fumaric acid | Adipic acid | 145 | A<br>B | 11<br>14 |
| 14 | Polypropyleneglycol (average molecular weight: 400). | Ethyleneglycol-1,3-bis-p-carboxyl phenyl ethane. | do | do | 139 | A<br>B | 11<br>12 |

NOTES:
1. Mole ratio of diol to dicarboxylic acid was 1:1.
2. Mole ratio of etherdiol to ester diol was 4:6.
3. Mole ratio of unsaturated dicarboxylic acid to saturated dicarboxylic acid was 1:1.

Preparation of unsaturated polyester in Example 1

100 g. of polyethyleneglycol having an average molecular weight of 200 were maintained at a temperature of 220° C. to 240 C. under a nitrogen atmosphere and 58 g. of fumaric acid and 1 g. of p-toluenesulfonic acid were added thereto and the reaction was continued for 10 hours while the water produced was distilled off to give an unsaturated polyester having an acid value of 16 and a fusing point of 110° C.

In Examples 2 to 4 the unsaturated polyesters were prepared in the same manner as in Example 1.

Preparation of esterdiol in Example 5

To 824 g. of dimethyl terephthalate and 789 g. of ethyleneglycol there was added 0.5 g. of zinc acetate and the mixture was heated at a temperature of 180° C. to 200° C. under a nitrogen atmosphere. 271 g. of the methanol produced were distilled off and the resulting mixture was further heated at a temperature of 220° C. to 240° C. while 453 g. of ethyleneglycol were distilled off to give bis-beta-hydroxyethyl terephthalate having a degree of polymerization of 3.2.

Preparation of unsaturated polyester in Example 5

To the resulting esterdiol there were added 144 g. of fumaric acid and 3 g. of p-toluenesulfonic acid and the mixture was heated at 240° C. for 8 hours under a nitrogen atmosphere while the water was distilled off to give an unsaturated polyester having an acid value of 16.5 and a fusing point of 184° C.

In Examples 6 to 8 the unsaturated polyesters were prepared in the same manner as in Example 5.

Preparation of esterdiol in Example 13

To 789 g. of ethyleneglycol there were added 824 g. of dimethyl terephthalate and 0.5 g. of zinc acetate and the mixture was heated at a temperature of 180° C. to 200° C. for 80 minutes under a nitrogen atmosphere while 271 g. of the methanol were distilled off. The reaction temperature was gradually increased to a temperature of 220° C. to 240° C. and the resulting mixture was further reacted for 2.5 hours while 456 g. of ethyleneglycol were distilled off.

Preparation of unsaturated polyester in Example 13

To the resulting esterdiol there were added 155 g. of fumaric acid, 105.5 g. of adipic acid and 3 g. of p-toluenesulfonic acid while the temperature was maintained at 240° C. After 30 minutes 523 g. of polyethyleneglycol having an average molecular weight of 600 were added to the mixture and the resulting mixture was reacted at 240° C. for 8 hours under a nitrogen atmosphere while the water produced was distilled off to give an unsaturated polyester having an acid value of 21.4 and a fusing point of 145° C.

In Examples 9 to 12 and 14, the unsaturated polyesters were prepared in the same manner as in Example 13.

EXAMPLE 15 TO 29

To 100 g. of the unsaturated polyester having a fusing point of 142° C. produced by the conventional condensation reaction of 0.5 part of dipropyleneglycol, 0.5 part of bis-beta-hydroxyethylmethylene-bisphenyl-dicarboxyl obtained by the ester-exchange reaction of ethyleneglycol and dimethyl ester of p,p'-diphenylmethane dicarboxylic acid, 0.5 part of fumaric acid and 0.5 part of adipic acid, there were added 25 g. of N-methylol-acrylamide, 25 g. of acrylic acid, 1.0 g. of allylbenzoin and 0.02 g. of hydroquinone and 100 g. of the resulting mixture were dissolved in a variety of the solvents shown in Table 2 to give a photosensitizing solution. An aluminum plate of 0.5 mm. in thickness, grained at 800 mesh, was coated with the photosensitizing solution by a roll coater at a rotating rate of 15 r.p.m. and dried to produce a photosensitizing plate. The plate was placed in a vacuum frame and exposed to a 500 w. high pressure mercury lamp at a distance of 80 cm. for 70 seconds through a negative film of the test chart having characters of 7 to 34 points and developed with a 0.6% aqueous sodium hydroxide solution, dried and coated with rubber with a cellulose sponge by hand to give a relief lithographic plate for offset printing.

TABLE 2

| Example number | Solvent | Mole ratio of solvents | Weight ratio of photopolymerizable component to solvent | Relative during velocity (Vr) | Viscosity (cp.) | Thickness of layer (μ) | Result of printing [1] |
|---|---|---|---|---|---|---|---|
| 15 | Chloroform | | 1:10 | 19,280 | 125 | 68 | Bad. |
| 16 | Dichloroethane | | 1:10 | 26,780 | 115 | 74 | Bad. |
| 17 | Dibromoethylene | | 1:20 | 1,690 | 10 | 10 | ~ood. |
| 18 | Methylethyl ketone | | 1:20 | 5,620 | 8 | 14 | Do. |
| 19 | Diacetone alcohol | | 1:15 | 1,280 | 10 | 12 | Do. |
| 20 | Dioxane | | 1:15 | 2,380 | 24 | 22 | Do. |
| 21 | Dioxolan | | 1:15 | 5,180 | 22 | 26 | Do. |
| 22 | Pyridine | | 1:15 | 1,220 | 25 | 22 | Do. |
| 23 | Trichloroethylene acetone | 3:1 | 1:10 | 8,310 | 95 | 57 | Do. |
| 24 | Isobutyl bromide-1,2-dichloroethane | 1:1 | 1:15 | 4,940 | 22 | 24 | Do. |
| 25 | Methylethyl ketone dioxane | 1:5 | 1:15 | 2,920 | 26 | 25 | Do. |
| 26 | Chloroform dioxane | 6:1 | 1:15 | 16,840 | 27 | 27 | Bad. |
| 27 | do | 1:1 | 1:15 | 10,830 | 24 | 24 | Bad. |
| 28 | do | 1:6 | 1:15 | 4,800 | 23 | 23 | Good. |
| 29 | Dioxane acetone methanol | 5:1:1 | 1:15 | 3,626 | 21 | 23 | Do. |

[1] As the result of printing, the tone reproduction of the negative was examined.

EXAMPLES 30 TO 39

One part of polyethyleneglycol having an average molecular weight of 600, 0.5 part of fumaric acid and 0.5 part of terephthalic acid were polycondensed by the conventional method and the resulting unsaturated polyester had a melting point of 125° C. 100 g. of the unsaturated polyester, 30 g. of acrylamide, 20 g. of styrene, 2 g. of benzoin methylether and 0.02 g. of beta-naphthol were thoroughly mixed and 100 g. of the mixture were dissolved in 1.500 g. of dioxane-acetone in the specified mole ratio shown in Table 3 to give a photosensitizing solution. An aluminum plate of 0.3 mm. in thickness, grained at 800 mesh, was coated with the photosensitizing solution by a flow coater with an edge clearance of 0.5 mm., varying a feeding volume of the photosensitizing solution and a rate of the aluminum plate. The resulting photosensitizing plate was placed in a vacuum frame and exposed to 6 kw. carbon arc lamp at a distance of 1 m. for 2 minutes through a negative film of 150 lines per inch and developed with a 0.5% aqueous sodium hydroxide solution, dried and coated with rubber with a sponge by hand to give a relief lithographic plate for offset printing.

TABLE 3

| Example number | Dioxane acetone (mole ratio) | Relative velocity (Vr) | Viscosity (cp.) | Feeding volume (cc./min.) | Rate of aluminum (m./min.) | Thickness of layer (μ) |
|---|---|---|---|---|---|---|
| 30 | 10:2 | 3,720 | 25 | 40 | 100 | 76 |
| 31 | 10:2 | 3,720 | 25 | 80 | 100 | 145 |
| 32 | 10:4 | 4,680 | 24 | 40 | 100 | 82 |
| 33 | 10:4 | 4,680 | 24 | 80 | 100 | 152 |
| 34 | 4:10 | 8,150 | 22 | 40 | 100 | 88 |
| 35 | 4:10 | 8,150 | 22 | 80 | 100 | 168 |
| 36 | 2:10 | 9,100 | 21 | 40 | 100 | 91 |
| 37 | 10:2 | 3,720 | 25 | 80 | 150 | 66 |
| 38 | 10:2 | 3,720 | 25 | 80 | 200 | 22 |
| 39 | 10:4 | 4,680 | 24 | 80 | 150 | 68 |

EXAMPLES 40 TO 44

To 100 g. of the unsaturated polyester having a melting point of 102° C. produced from 1 part of polyethyleneglycol having an average molecular weight of 600, 0.5 part of fumaric acid and 0.5 part of adipic acid there were added 25 g. of methylenebisacrylamide, 25 g. of itaconic acid, 2 g. of benzoin and 0.01 g. of hydroquinone and 100 g. of the resulting mixture were dissolved in 2,000 g. of trichloroethylenemethylethyl ketone in a 1:2 mole ratio to give a photosensitizing solution having a viscosity of 10 cps. and a relative drying velocity of 6,280. A zinc plate of 1 mm. in thickness, grained at 600 to 800 mesh, was coated with the photosensitizing solution by a vertical-type whirler at the specified rotating rate set forth in Table 4 to produce a photosensitizing plate. The plate was placed in a vacuum frame and exposed to a 500 w. mercury lamp at a distance of 50 cm. for 2 minutes through a negative of the test chart having characters of 7 to 34 points and developed with a 0.5% aqueous sodium hydroxide solution, dried and coated with rubber with a cellulose sponge by hand to give a relief lithographic plate for offset printing. Using each of the resulting plates more than 300,000 copies could be printed.

TABLE 4

| | Rotating rate (r.p.m.) | Thickness of layer (μ) |
|---|---|---|
| Example No.: | | |
| 40 | 50 | 32 |
| 41 | 75 | 26 |
| 42 | 100 | 24 |
| 43 | 150 | 18 |
| 44 | 200 | 12 |

EXAMPLE 45

100 g. of the unsaturated polyester obtained in Example 40, 15 g. of ethyl acrylate, 30 g. of styrene, 2 g. of diphenyl disulfide and 0.1 g. of betanaphthol were thoroughly mixed and 100 g. of the mixture were dissolved in 1,500 g. of 1,2-dichloroethane-dioxane-methanol in a 4:4:1 mole ratio to give a photosensitizing solution having a viscosity of 27 cps. and a relative drying velocity of 3,620. An aluminum plate of 0.3 mm. in thickness was coated with the photosensitizing solution by a roll coater at a rotating rate of 10 r.p.m. to produce a photosensitizing plate having a layer of 25μ. The plate was placed in a vacuum frame and exposed to a 2 kw. carbon arc lamp at a distance of 1 m. for 3 minutes through a negative of 150 lines per inch and developed with a 0.5% aqueous sodium hydroxide solution, dried and coated with rubber with a cellulose sponge by hand to give a relief lithographic plate for offset printing. Embossed paper was printed at a printing rate of 10,000 copies per hour using the resulting plate.

What is claimed is:

1. A photosensitizing solution having a viscosity of about 5 to 150 centipoises at 20° C. comprising:

(A) a photosensitive composition comprising (a) an unsaturated polyester, (b) 5 to 150 parts by weight, based on 100 parts by weight of said unsaturated polyester, of at least one additional polymerizable ethylenically unsaturated monomer containing at least one $CH_2=C<$ group and having a boiling point about 100° C. at normal atmospheric presure and (c) 0.001 to 10 parts by weight, based on 100 parts by weight of said unsaturated polyester, of a photopolymerization initiator, said unsaturated polyester being prepared by the interpolymerization, polycondensation reaction of a diol component and an acid component in substantially stoichiometric amounts, wherein said diol component comprises an etherdiol (I) of the formula:

$$HO\left(R_1-O\right)_x H$$

wherein $R_1$ represents alkylene group having 2 to 4 carbon atoms; $x$ is 2 to 100 and 10 to 90 mole percent, based on the total diol content of an esterdiol (II) of the formula:

$$HO\left[(CH_2)_y-O-\overset{O}{\overset{\|}{C}}-R_2-\overset{O}{\overset{\|}{C}}-O\right]_z(CH_2)_y-OH$$

wherein R represents a member selected from the group consisting of:

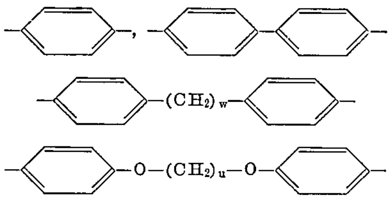

and naphthylene group, $y$ is 2 to 4; $z$ is 2 to 10; and $w$ and $u$ are respectively 1 to 4; and wherein said acid component comprises an unsaturated dicarboxylic acid, an anhydride thereof or a lower alcohol ester thereof, and (B) at least one solvent selected from the group consisting of chlorinated aliphatic hydrocarbons, brominated aliphatic hydrocarbons, ketones, cyclic ethers and pyridine, said solvent having a relative drying velocity of 500 to 10,000.

2. A photosensitizing solution as claimed in claim 1, wherein said solvent is used together with at least one lower aliphatic alcohol having 1 to 4 carbon atoms.

3. A photosensitizing solution as claimed in claim 1, wherein said photosensitive composition additionally contains about 0.01 to 2 parts by weight, based upon 100 parts by weight of the unsaturated polyester, of a thermal polymerization inhibitor.

4. A photosensitizing solution as claimed in claim 1, wherein the weight ratio of the photosensitive composition to the solvent is in the range of 1:5 to 1:25.

5. A photosensitizing solution as claimed in claim 1, wherein the chlorinated aliphatic hydrocarbon is selected from the group consisting of dichloromethane, chloroform, tetrachloromethane, 1,2-dichloroethane, trichloroethylene and tetrachloroethylene.

6. A photosensitizing solution as claimed in claim 1, wherein the brominated aliphatic hydrocarbon is selected from the group consisting of dibromoethane, isobutyl bromide and isoamyl bromide.

7. A photosensitizing solution as claimed in claim 1, wherein the ketone is selected from the group consisting of acetone, methylethyl ketone and diacetone alcohol.

8. A photosensitizing solution as claimed in claim 1, wherein the cyclic ether is selected from the group consisting of dioxane, tetrahydrofuran, dioxolan and tetrahydropyrane.

9. Relief lithographic plate comprising a support of about 0.1 to 2.0 mm. in thickness and an image area of 10 to 200μ which is the photopolymerized product of a photosensitive composition which comprises a photopolymerizable composition comprising (A) an unsaturated polyester which is the polycondensation interpolymerization product of at least one member (a) selected from the group consisting of a compound (1) of the formula:

$$HO\left(R_1-O\right)_x H$$

wherein $R_2$ represents alkylene group having 2 to 4 carbon atoms; $x$ is 2 to 100 and a compound (2) of the formula;

$$HO\left[(CH_2)_y-O-\overset{O}{\overset{\|}{C}}-R-\overset{O}{\overset{\|}{C}}-O\right]_z(CH_2)_y-OH$$

wherein R represents a member selected from the group consisting of

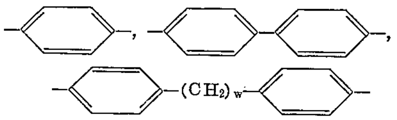

and naphthylene group; $y$ is 2 to 4; $z$ is 1 to 10; and $w$ is 1 to 4 and an unsaturated dicarboxylic acid (b) having a fusing point above 100° C.;

(B) about 10 to 150 parts by weight, based upon 100 parts of said unsaturated polyester, of at least one ethylenically unsaturated monomer, different from the unsaturated polyester polymer (A); and (C) about 0.01 to 5 parts by weight, based upon 100 parts by weight of said unsaturated polyester, of a photopolymerization initiator.

10. A relief lithographic plate as claimed in claim 9, wherein the support is selected from paper, metal, alloy, plastic and cellulose ester.

11. A relief lithographic plate as claimed in claim 10, wherein the support is aluminum plate of 0.3 to 0.5 mm. in thickness.

12. A relief lithographic plate as claimed in claim 10, wherein the support is zinc plate of 0.3 to 1.0 mm. in thickness.

13. A process for preparing relief lithographic plates which comprises forming a photopolymerizable layer by coating a support of 0.1 to 2.0 mm. in thickness with the photosensitizing solution claimed in claim 1 in a thickness between 10 to 200μ, exposing a selected area of the photopolymerizable layer to actinic light until photopolymerization of the exposed area of said layer is substantially completed, removing the non-exposed area of said layer and subsequently treating the surface of said layer with a desensitizing agent.

References Cited

UNITED STATES PATENTS

| | | | |
|---|---|---|---|
| 3,483,169 | 12/1969 | Case et al. | 260—861 |
| 3,196,131 | 7/1965 | Mayer et al. | 260—861 |
| 2,855,373 | 10/1958 | Guenther | 260—861 |

NORMAN G. TORCHIN, Primary Examiner
E. C. KIMLIN, Assistant Examiner

U.S. Cl. X.R.

96—115

UNITED STATES PATENT OFFICE
CERTIFICATE OF CORRECTION

Patent No. 3,677,755 Dated July 18, 1972

Inventor(s) Hisaaki Fukui et al

It is certified that error appears in the above-identified patent and that said Letters Patent are hereby corrected as shown below:

Col. 1, after line 9

The following Foreign Application Priority Data is missing:

"Japan, No. 64952 of September 11, 1968 and

Japan No. 80382 of November 5, 1968".

Signed and sealed this 6th day of March 1973.

(SEAL)
Attest:

EDWARD M.FLETCHER,JR.
Attesting Officer

ROBERT GOTTSCHALK
Commissioner of Patents